United States Patent [19]
Markle

[11] Patent Number: 5,886,432
[45] Date of Patent: Mar. 23, 1999

[54] MAGNETICALLY-POSITIONED X-Y STAGE HAVING SIX-DEGREES OF FREEDOM

[75] Inventor: David A. Markle, Saratoga, Calif.

[73] Assignee: Ultratech Stepper, Inc., San Jose, Calif.

[21] Appl. No.: 848,548

[22] Filed: Apr. 28, 1997

[51] Int. Cl.⁶ ................................................. H02K 41/02
[52] U.S. Cl. .............................. 310/12; 310/17; 310/15; 414/935
[58] Field of Search .................................. 310/12, 13, 14, 310/156, 17, 15; 414/935, 936, 347; 198/619

[56] References Cited

U.S. PATENT DOCUMENTS

| | | | |
|---|---|---|---|
| 3,370,205 | 2/1968 | Dukes et al. | 317/123 |
| 4,184,188 | 1/1980 | Briglia | 361/234 |
| 4,502,094 | 2/1985 | Lewin et al. | 361/234 |
| 4,520,421 | 5/1985 | Sakitani et al. | 361/234 |
| 4,556,362 | 12/1985 | Bahnck et al. | 414/744 |
| 4,618,292 | 10/1986 | Judge et al. | 406/19 |
| 4,624,617 | 11/1986 | Belna | 414/347 |
| 4,761,579 | 8/1988 | Delassus | 310/90.5 |
| 4,790,258 | 12/1988 | Drage et al. | 118/500 |
| 4,877,123 | 10/1989 | Fukuwatari et al. | 198/619 |
| 5,080,380 | 1/1992 | Nakagawa et al. | 279/1 |
| 5,150,272 | 9/1992 | Danley et al. | 361/144 |
| 5,155,651 | 10/1992 | Yoda et al. | 361/144 |
| 5,196,745 | 3/1993 | Trumper | 310/12 |
| 5,207,437 | 5/1993 | Barnes et al. | 279/128 |
| 5,284,411 | 2/1994 | Enomoto et al. | 414/217 |
| 5,334,892 | 8/1994 | Chitayat | 310/12 |
| 5,359,490 | 10/1994 | Oguro | 361/144 |
| 5,377,071 | 12/1994 | Moslehi | 361/234 |
| 5,417,537 | 5/1995 | Miller | 414/217 |
| 5,421,695 | 6/1995 | Kimura | 414/744.5 |
| 5,631,618 | 5/1997 | Trumper et al. | 335/299 |

FOREIGN PATENT DOCUMENTS 480549A  4/1992  European Pat. Off. ........ B65G 54/02

*Primary Examiner*—Nestor Ramirez
*Assistant Examiner*—Burton Mullins
*Attorney, Agent, or Firm*—Allston L. Jones

[57] ABSTRACT

The respective square cross-section permanent magnets of each of a plurality of spaced Halbach magnet arrays, attached to the bottom of movable X-Y stage and aligned with a given one of the X and Y axes, are spaced from one another parallel to the other one of the X and Y axes of by the width of the square cross-section cooperates with both a first set of a plurality of flat stationary electromagnet coils of wire and a second set of a plurality of flat stationary electromagnet coils of wire that substantially lie in proximate horizontal X, Y planes and, respectively, are angularly offset by +45° and −45° with respect to the given one of the X and Y horizontal axes to provide a lateral translational force on the stage with respect to the horizontal X and/or Y axes and/or a levitating translational force on the stage with respect to the vertical Z axis. First, second and third pairs of spaced electromagnets attached to the bottom of movable X-Y stage and situated in spaces between adjacent Halbach magnet arrays cooperate with both the first and second sets electromagnet coils of wire to create couples that can tilt the stage about the X and/or Y axes and/or yaw the stage about the Z axis. This configuration of Halbach magnet arrays and electromagnetic coils provides a compact and energy efficient X-Y stage suitable for use in a wafer-stepper for positioning a large (e.g., 200–300 mm.) silicon wafer employed in the photolithographic manufacture of monolithic integrated circuits.

19 Claims, 6 Drawing Sheets

MAGNETICALLY-POSITIONED X-Y STAGE HAVING SIX-DEGREES OF FREEDOM

BACKGROUND OF THE INVENTION

1. Field of the Invention

This invention relates to improved magnetic apparatus for precisely positioning an X-Y movable stage with respect to a fixed base and, more particularly, to such a stage suitable for use in a wafer-stepper employed in the photolithographic manufacture of monolithic integrated circuits.

2. Description of the Prior Art

In the past, stepper motors have been used for the purpose of positioning the X-Y stage of a wafer-stepper with six degrees of freedom. Recently, however, prior-art magnetic positioning apparatus has been developed for this purpose. This magnetic positioning apparatus provides substantially higher positioning resolution and other advantages over stepper motors. These other advantages include:

(1) the monolithic nature of such magnetic positioning apparatus allows direct coupling between the metrology system, the stage, and the wafer or substrate;

(2) the direct electromagnetic coupling in all 6 axes eliminates the need for precision robbing, slow mechanisms such as focus actuators and coarse theta adjustment mechanisms;

(3) the design of such magnetic positioning apparatus lends itself to a high bandwidth, servo controlled, positioning system that settles much faster (because of the higher bandwidth) than other types of positioning stage; and (4) such magnetic positioning apparatus is equally applicable to step-and-repeat or step-and-scan types of operation and does not exhibit cogging that inhibits travel at constant velocity with Sawyer motor based stages.

A first example of a prior-art magnetic positioning apparatus suitable for use in a wafer-stepper is disclosed in U.S. Pat. No. 5,196,745, issued Mar. 23, 1993. The magnetic positioning apparatus disclosed in U.S. Pat. No. 5,196,745 employs a plurality of stage-attached permanent magnetic arrays, each of which comprises a series of adjacent oppositely-poled permanent magnets (i.e., magnetic fields of each pair of adjacent magnets are rotated 180° with respect to one another) that cooperate with stationary electromagnetic coil arrays in the horizontal (X, Y) plane, to produce the proper lateral forces to provide desired motion of the X-Y stage in X and/or Y directions. Additional electromagnets provide controllable forces for levitating the stage-attached permanent magnetic arrays' forces in the vertical (Z) direction with respect to the stationary electromagnetic coil arrays to maintain a desired air gap therebetween and controllable couples for providing small angular rotations of the stage-attached permanent magnetic arrays about the X, Y and/or Z axes.

Known in the art is a so-called Halbach magnetic array, which comprises a series of permanent magnets in which the respective magnets are poled so that the magnetic fields of each pair of adjacent magnets are rotated 90° with respect to one another.

A second example of prior-art magnetic positioning apparatus for use in a wafer-stepper is shown in FIGS. 1 and 2 and is described in detail below. However, briefly, this second example comprises four spatially-separated Halbach magnetic arrays extending from each of the four corners of an X-Y stage, with each of the Halbach magnetic arrays cooperating with a stationary electromagnetic coil array in the horizontal (X, Y) plane, thereby achieving (1) controllable lateral forces in the X and Y horizontal directions and (2) controllable levitating forces in the vertical Z direction which are also capable of creating controllable couples for providing small angular rotations about the X, Y and/or Z axes. Thus, this second example of prior-art magnetic positioning apparatus differs from the above-described first example of prior-art magnetic positioning apparatus in that it does away with the need for the aforesaid additional electromagnets for providing both controllable levitating forces in the vertical Z and controllable couples for providing small angular rotations about the X, Y and/or Z axes.

Currently, wafers as large as 300 millimeters (mm.) in diameter need to be processed. Thus, the overall horizontal area of the second example of the prior-art magnetic positioning apparatus for use in a wafer-stepper for processing 300 mm is very large (significantly greater than 4×4=16 square feet). The problem caused by this very large horizontal area is that it makes it very hard to adequately support the photolithographic projection optics, while also complicating the layout of the wafer-stepper.

SUMMARY OF THE INVENTION

The present invention provides a new configuration of Halbach magnet arrays and electromagnetic coils that leads to a much more compact and energy efficient X-Y stage, thereby solving the aforesaid problem.

More specifically, the present invention provides an improvement in apparatus for magnetically positioning a movable X-Y stage with respect to X and Y horizontal axes and a Z vertical axis. The improved apparatus comprises (1) a first set of a plurality of flat stationary electromagnet coils of wire that substantially lie in a first horizontal X, Y plane and are angularly offset in the first horizontal X, Y plane by plus a given oblique angle (preferably +45°) with respect to a given one of the X and Y horizontal axes; (2) a second set of a plurality of flat stationary electromagnet coils of wire that substantially lie in a second horizontal X, Y plane proximate to said first horizontal X, Y plane and are angularly offset in the second horizontal X, Y plane by minus a given oblique angle (preferably −45°) with respect to the given one of the X and Y horizontal axes; and (3) a Halbach array of magnets (preferably permanent magnets) attached to the movable X-Y stage, which array substantially lies in a horizontal X, Y plane, is oriented substantially parallel to the given one of the X and Y horizontal axes, and is situated in cooperative relationship with both the first and second sets. This configuration permits a lateral force in the X and/or Y horizontal directions and/or a vertical force in the Z vertical direction to be selectively generated in accordance with the phase and magnitude of current energizing the wire of each of the plurality of flat stationary electromagnet coils of the first and second sets.

DESCRIPTION OF THE PREFERRED EMBODIMENT

Figure 1:
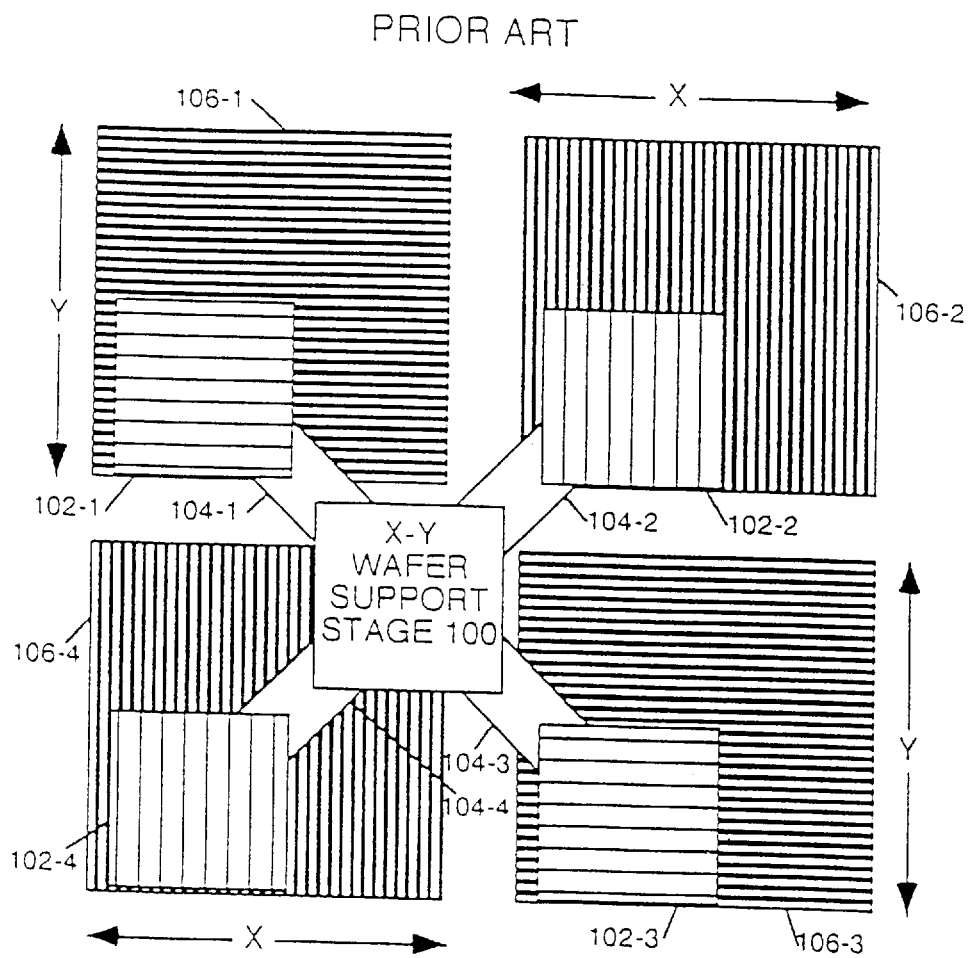
FIG. 1 schematically shows a plan view of the aforesaid second example of the prior-art magnetic positioning apparatus.

Referring to FIG. 1, there is schematically shown a plan view of prior-art apparatus for magnetically positioning the X-Y stage of a wafer-stepper with six degrees of freedom. This prior-art apparatus comprises (1) a movable structure which includes X-Y wafer support stage 100 having Halbach magnet array 102-1 attached to the upper-left corner of stage 100 by member 104-1, Halbach magnet array 102-2 attached to the upper-right corner of stage 100 by member 104-2, Halbach magnet array 102-3 attached to the lower-right corner of stage 100 by member 104-3 and Halbach magnet array 102-4 attached to the lower-left corner of stage 100 by member 104-4, and (2) four separate stationary single sets 106-1, 106-2, 106-3 and 106-4 of flat electromagnet coils of wire, which, respectively, form first, second third and fourth cooperative configurations with corresponding ones of Halbach magnet arrays 102-1, 102-2, 102-3 and 102-4. Specifically, the wires of the single sets of stationary flat electromagnet coils 106-1 and 106-3 extend parallel to the X axis of a substantially horizontal X, Y plane, while the wires of the single sets of stationary flat electromagnet coils 106-2 and 106-4 extend parallel to the Y axis of this X, Y plane. Further, Halbach magnet arrays 102-1 and 102-3, which, respectively, cooperate with the single sets of flat stationary coils 106-1 and 106-3, are stacked parallel to the Y axis, while Halbach magnet arrays 102-2 and 102-4, which, respectively, cooperate with the single sets of stationary flat coils 106-2 and 106-4, are stacked parallel to the X axis.

Figure 2:
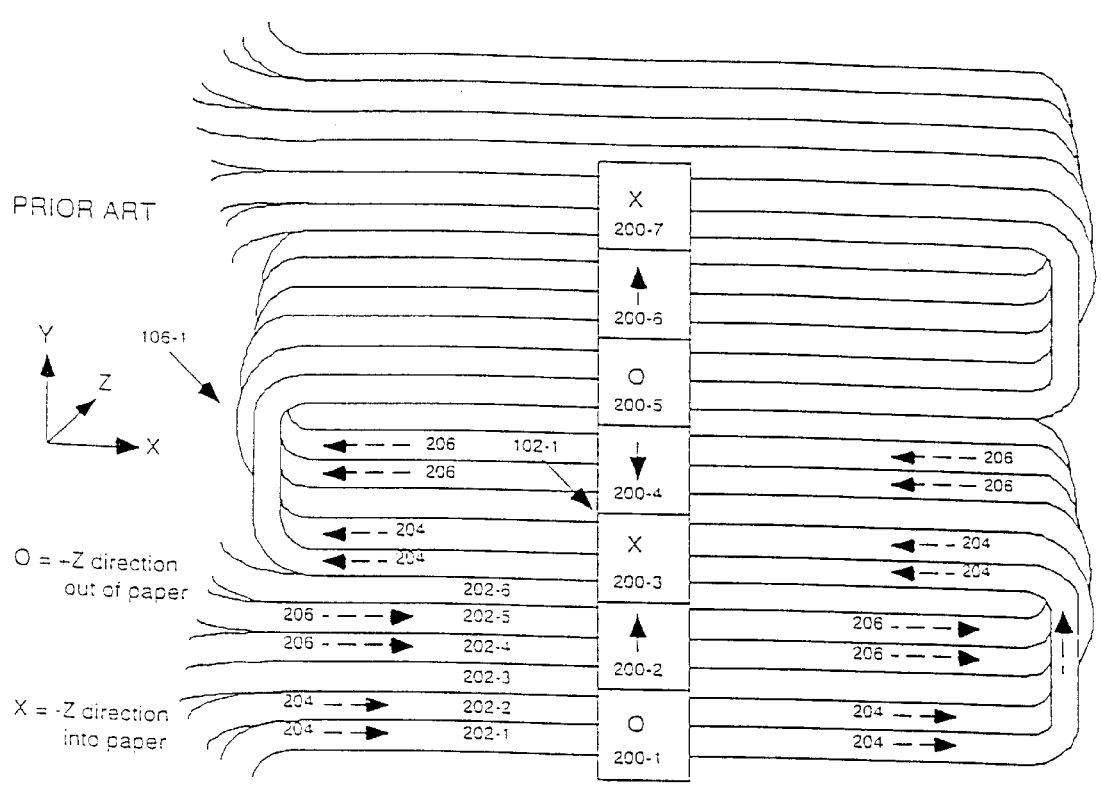
FIG. 2 illustrates the cooperative configuration of one of the Halbach magnet arrays with respect to its single set of electromagnetic coils that is employed in the prior-art magnetic positioning apparatus shown in FIG. 1.

FIG. 2, in more detail, exemplifies the cooperative configuration of Halbach magnet array 102-1 with respect to the single set of stationary flat electromagnet coils 106-1. As shown in the FIG. 2 example, Halbach magnet array 102-1 comprises a stack of contiguous permanent magnets 200-1 . . . 200-7 extending in the Y direction, while the single set 106-1 comprises a plurality of six, side-by-side, equispaced stationary flat electromagnet coil wires 202-1 . . . 202-6 extending in the Y direction in an X, Y plane situated below Halbach magnet array 102-1. The distance between successive passes across the platen for each one of coil wires 202-1 . . . 202-6 is assumed in the FIG. 2 example to be substantially equal to the extent in the Y direction of two adjacent contiguous magnets of Halbach array 102-1. Further, as known in the art, the phase and magnitude of current energizing each individual one of coil wires 202-1 . . . 202-6 may be continuously determined by a computer-controlled servo metrology system responsive to fed back values of the X, Y, and Z position coordinates of X-Y stage 100 at each instant of time.

Each of Halbach array magnets 200-1 and 200-5 is poled with its north pole on the top of the magnet and its south pole on the bottom of the magnet, so that its magnetic field within the magnet extends in the Z direction and emerges from the top of the magnet. Each of magnets 200-3 and 200-7 is poled with its north pole on the bottom of the magnet and its south pole on the top of the magnet, so that its magnetic field within the magnet extends in the Z direction and emerges from the bottom of the magnet. As indicated by the direction of their arrow, magnets 200-2 and 200-6 are poled with their north pole on that face thereof which, respectively, interfaces a face of magnets 200-3 and 200-7 and with their south pole on that face thereof which, respectively, interfaces a face of magnets 200-1 and 200-5, so that their magnetic fields within the magnets extends in the Y direction of their arrows. Similarly, magnet 200-4 is poled with its north pole on that face thereof which interfaces a face of magnet 200-3 and with its south pole on that face thereof which interfaces a face of magnet 200-5, so that its magnetic field within the magnet extends in a Y direction which (as indicted by its arrow direction) is opposite to the Y direction of the magnetic fields of magnets 200-2 and 200-6. The effect of Halbach magnet array 102-1, taken as a whole with its magnets 200-1 . . . 200-7 poled as shown in FIG. 2, tends to cancel the array's magnetic field in the region above the array and tends to double the array's resultant magnetic field intensity in the region below the array (where interaction with the respective magnetic fields of electromagnet coils 202-1 . . . 202-6 takes place).

Forces on Halbach magnet array 102-1 may be selectively generated in accordance with the phase and magnitude of current energizing the wire of each of electromagnet coils 202-1 . . . 202-6. More particularly, with Halbach magnet array 102-1 being positioned with respect to the set of electromagnet coils 106-1 as shown in FIG. 2, respective energizing currents, having the phase indicated by arrows 204, in each of coils 202-1 and 202-2 (which generate magnetic fields which interact with the magnetic fields of magnets 200-1, 200-3, 200-5 and 200-7) will generate a lateral force on array 102-1 that causes array 102-1 to move toward the top of the paper in the Y direction (right hand rule). Similarly, respective energizing currents, having the phase indicated by arrows 206, in each of coils 202-4 and 202-5 (which generate magnetic fields which interact with the magnetic fields of magnets 200-2, 200-4, and 200-6) will generate a levitating force on array 102-1 that causes array 102-1 to move upward in the Z direction. Because, in the position shown in FIG. 2, each of coils 202-3 and 202-6 straddles each of pairs of adjacent magnets of array 102-1, no energizing current is applied to coils 202-3 and 202-6 at this time. However, as array 102-1 moves toward the top of the paper in the Y direction, the respective currents energizing the electromagnet coils of set 106-1 are commutated so that (1) those magnetic fields which interact with the magnetic fields of magnets 200-1, 200-3, 200-5 and 200-7 continue to generate a lateral force on array 102-1 that causes array 102-1 to move toward the top of the paper in the Y direction; (2) those magnetic fields which interact with the magnetic fields of magnets 200-2, 200-4, and 200-6 will continue to generate a levitating force on array 102-1 that causes array 102-1 to move upward in the Z direction; and (3) no energizing current is applied to those coils that straddle a pair of adjacent magnets of array 102-1.

In the case of the lateral force on array 102-1, it is apparent that array 102-1 can be caused to move toward the bottom of the paper in the Y direction by reversing the phase of the current energizing those electromagnet coils of set 106-1 which are then generating magnetic fields that interact with the magnetic fields of magnets 200-1, 200-3, 200-5 and 200-7 from that indicated by arrows 204. Further, the force and, therefore, the acceleration of movement toward the top or bottom of the paper, as the case may be, is determined by the magnitude of these energizing currents.

If the entire levitating force results from the interaction of the magnetic fields then being generated by those electromagnet coils of set 106-1 with the magnetic fields of magnets 200-2, 200-4, and 200-6, the amount array 102-1 is levitated is determined by a servo system controlling the magnitude of the current energizing those electromagnet coils of set 106-1. Because, in practice, the levitated movable structure is often quite heavy (e.g., the case in FIG. 1), the required magnitude of this energizing current becomes relatively large. To lower the required magnitude of the energizing current in this case, a fixed biasing levitating force may be provided by permanent magnets (not shown), and the fixed biasing levitating force may be varied slightly by adding thereto a small up or down force in the Z direction produced by the interaction of the magnetic fields then being generated by those electromagnet coils of set 106-1 with the magnetic fields of magnets 200-2, 200-4, and 200-6. In the case where the force of the permanent magnets just balances the weight of X-Y stage 100, the phase of the energizing levitation current is reversible and its magnitude is relatively small.

Returning to FIG. 1, it is apparent that, individually, each of the second, third and fourth cooperative configurations of respective Halbach magnet arrays 102-2, 102-3 and 102-4 with respect to the respective single sets of stationary flat electromagnet coils 106-2, 106-3 and 106-4, operates in a manner which is similar to the operation of the above-described first cooperative configuration of Halbach magnet array 102-1 with respect to the single set of stationary flat electromagnet coils 106-1. However, by individually selecting the appropriate phase and magnitude of each energizing current applied to each of the wires of each set of electromagnet coils 106-1, 106-2, 106-3 and 106-4, these four cooperative configurations, operating together, are capable of (1) providing forces for translationally positioning X-Y wafer support stage 100 with respect to each of the X and Y axes over relatively large ranges, and (2) providing couples for rotationally positioning X-Y wafer support stage 100 about each of the X tilt axis, the Y tilt axis and the Z yaw axis over relatively small ranges, and (3) providing relatively small motion in the Z axis direction. However, in order to provide these required six degrees of freedom in the positioning of stage 100, an excessive area is occupied by an embodiment of the FIG. 1 X-Y wafer support stage positioning system of a size sufficient to support a large-diameter (e.g., 200 to 300 mm.) wafer.

Figure 3:
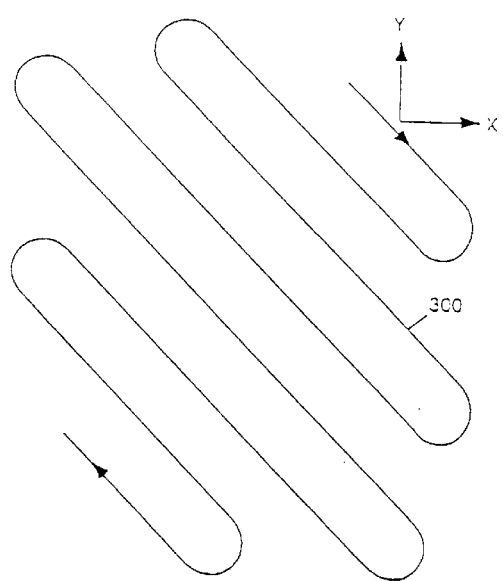
FIG. 3 illustrates the angular orientation of one of a first set of electromagnetic coils, all having the same angular orientation, in accordance with the principles of the present invention.
Figure 4:
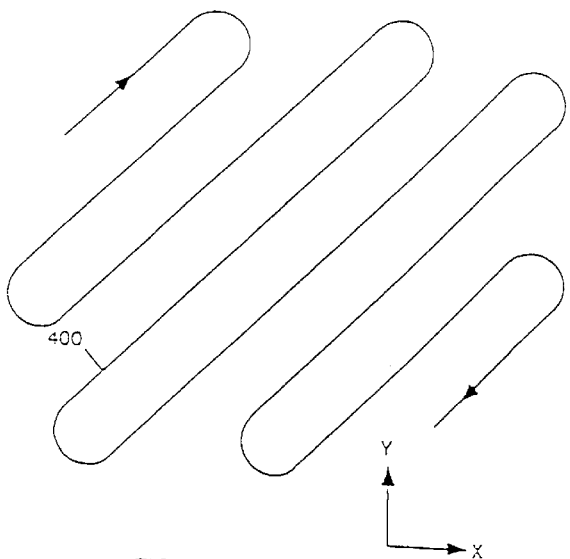
FIG. 4 illustrates the angular orientation of one of a second set of electromagnetic coils, all having the same angular orientation, in accordance with the principles of the present invention.
Figure 5:
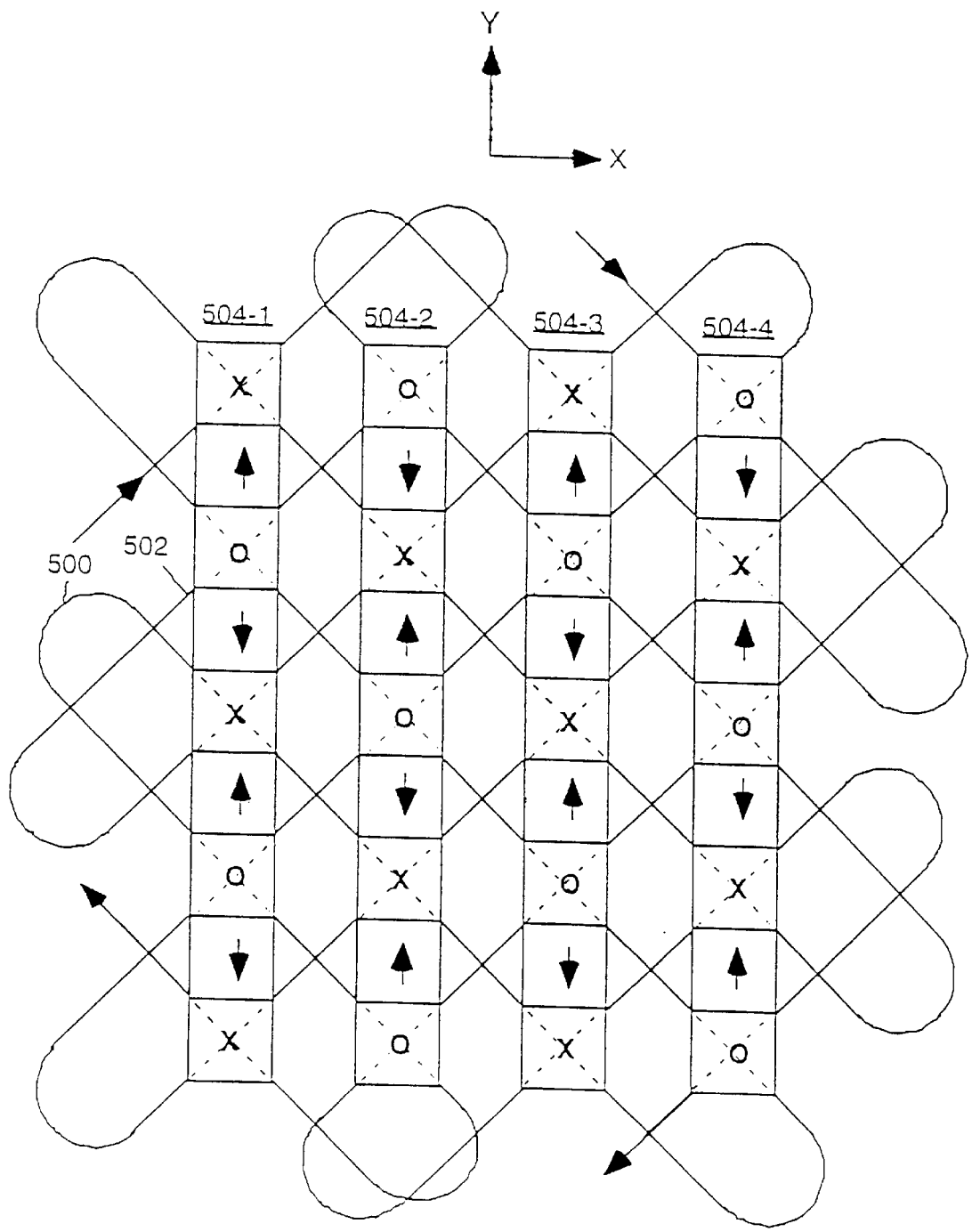
FIG. 5 is a plan view illustrating the cooperative spatial relationship among the Halbach magnet arrays, the one of the first set of electromagnetic coils of FIG. 3, and the one of the second set of electromagnetic coils of FIG. 4, in accordance with the principles of the present invention.

FIGS. 3, 4 and 5 are employed to teach the principles of the magnetic positioning system of the present invention for an X-Y wafer support stage, wherein the first and second sets of stationary flat electromagnet coil wires are configured to cooperate, together, with the same set of one or more movable Halbach magnet arrays. This results in a much more compact X-Y wafer support stage positioning system than that shown in FIG. 1. More specifically, (1) each of the first set of stationary flat electromagnet coil wires substantially lies in an X, Y plane and is offset at a given plus oblique angle with respect to the Y axis (preferably at a +45° angle, as exemplified by flat electromagnet coil wire 300 shown in FIG. 3), and (2) each of the second set of stationary flat electromagnet coil wires substantially also lies in an X, Y plane and is offset at a given minus oblique angle with respect to the Y axis (preferably at a −45° angle, as exemplified by flat electromagnet coil wire 400 shown in FIG. 4). For the purpose of clarity in the drawing, FIG. 5 exemplifies the cooperative relationship of only a particular one of the +45° electromagnet coil wires 500 of the first set and a corresponding one of the −45° electromagnet coil wires 502 of the second set with a set of four Halbach magnet arrays 504-1, 504-2, 504-3 and 504-4. As shown in FIG. 5, each of these four arrays is aligned parallel to the Y axis and is separated parallel to the X axis from an adjacent array by an amount equal to the width of the cross-section of each magnet of an array (each of the magnets shown in FIG. 5 having a square cross-section). Further, the respective magnetic poling of the magnets of arrays 504-2 and 504-4 is offset from the respective magnetic poling of the magnets of arrays 504-1 and 504-3 by twice the length of the cross-section magnets. Thus, with the four movable Halbach magnet arrays being positioned as shown in FIG. 5, both coil wires 500 and 502 are situated below and in cooperative spatial relationship with those magnets of all four Halbach magnet arrays having magnetic fields within the magnets that extend in the Z direction and result in a lateral force being produced. One or more additional pairs of corresponding electromagnet coil wires (not shown) of the first and second sets may be situated in cooperative spatial relationship with those magnets of all four Halbach magnet arrays that result in a lateral force being produced, while at least one pair of corresponding electromagnet coil wires (not shown) of the first and second sets is situated in cooperative spatial relationship with those magnets of all four Halbach magnet arrays that are poled to produce a levitating force.

It is apparent that a first diagonally-directed lateral force will be produced by the interaction of coil wire 500 with the magnets of all four Halbach magnet arrays in a direction determined by the phase of the energizing current applied to coil wire 500, and this first lateral force comprises a first component parallel to the X axis and a second component parallel to the Y axis. Similarly, a second diagonally-directed lateral force will be produced by the interaction of coil wire 502 with the magnets of all four Halbach magnet arrays in a direction determined by the phase of the energizing current applied to coil wire 502, and this second lateral force also comprises a first component parallel to the X axis and a second component parallel to the Y axis. Further, each of the energizing currents applied, respectively, to coil wire 500 and coil wire 502 may have an independently selectable magnitude and either selectable one of two alternative phases. Thus, a resultant lateral force for accelerating the four movable Halbach magnet arrays in any direction in the X, Y plane may be produced by suitably selecting the respective phases and magnitudes of the energizing currents applied to coil wires 500 and 502.

Similarly, a resultant vertical force for levitating the four movable Halbach magnet arrays by any desired amount may be produced by suitably selecting the respective phases and magnitudes of the energizing currents applied to those unshown electromagnet coil wires of each of the first and second sets that are situated in cooperative spatial relationship with those magnets of the Halbach magnet arrays that are poled to produce a force perpendicular to the plane of the paper.

In the preferred case shown in FIG. 5, the cross-section of each of the permanent magnets of the Halbach magnet arrays is a square and coil wires 500 and 502 are inclined, respectively, at +45° and −45° with respect to the Y axis. Thus, in this preferred case, the X and Y components of the individual diagonal lateral forces produced, respectively, by coil wires 500 and 502 are equal in magnitude to one another for acceleration in the X and/or Y directions. However, more generally, all that is required is that the shape of the cross-section of each of the magnets of the Halbach magnet arrays be symmetrical with respect to each of the X and Y axes. This includes, by way of examples, magnets with rectangular, circular or elliptical cross-sections. If the array of identically-poled magnets forms a rectangular, rather than a square, grid, then the orientation of the wires must be changed so that a wire passing through the center of one magnet also traverses the center of the other similarly oriented magnets. Therefore, in this latter case, it is necessary to appropriately adjust the relative magnitudes of the energizing currents applied, respectively, to the lateral-force producing coil wires of each of the first and second sets in order to compensate for the fact that the X and Y components of lateral force are inherently unequal in magnitude to one another. Further, electromagnets may be substituted for the permanent magnets of the Halbach magnet arrays.

Figure 6:
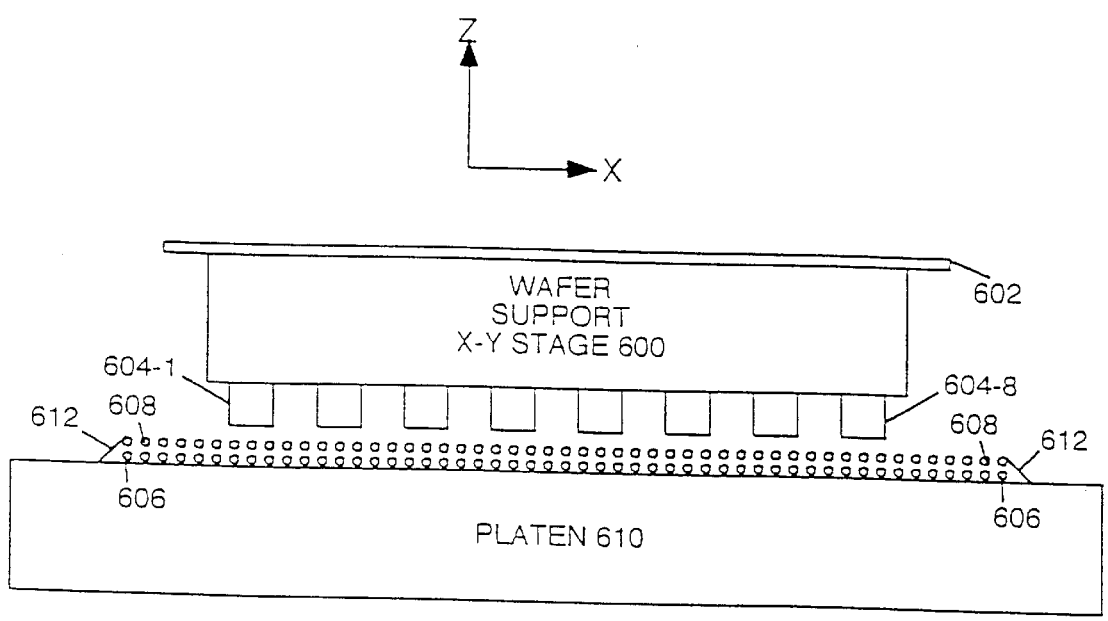
FIG. 6 shows a preferred embodiment of the present invention, which illustrates a side view of the spatial configuration among the wafer, wafer support X-Y stage, and the magnetic positioning apparatus therefor.
Figure 7:
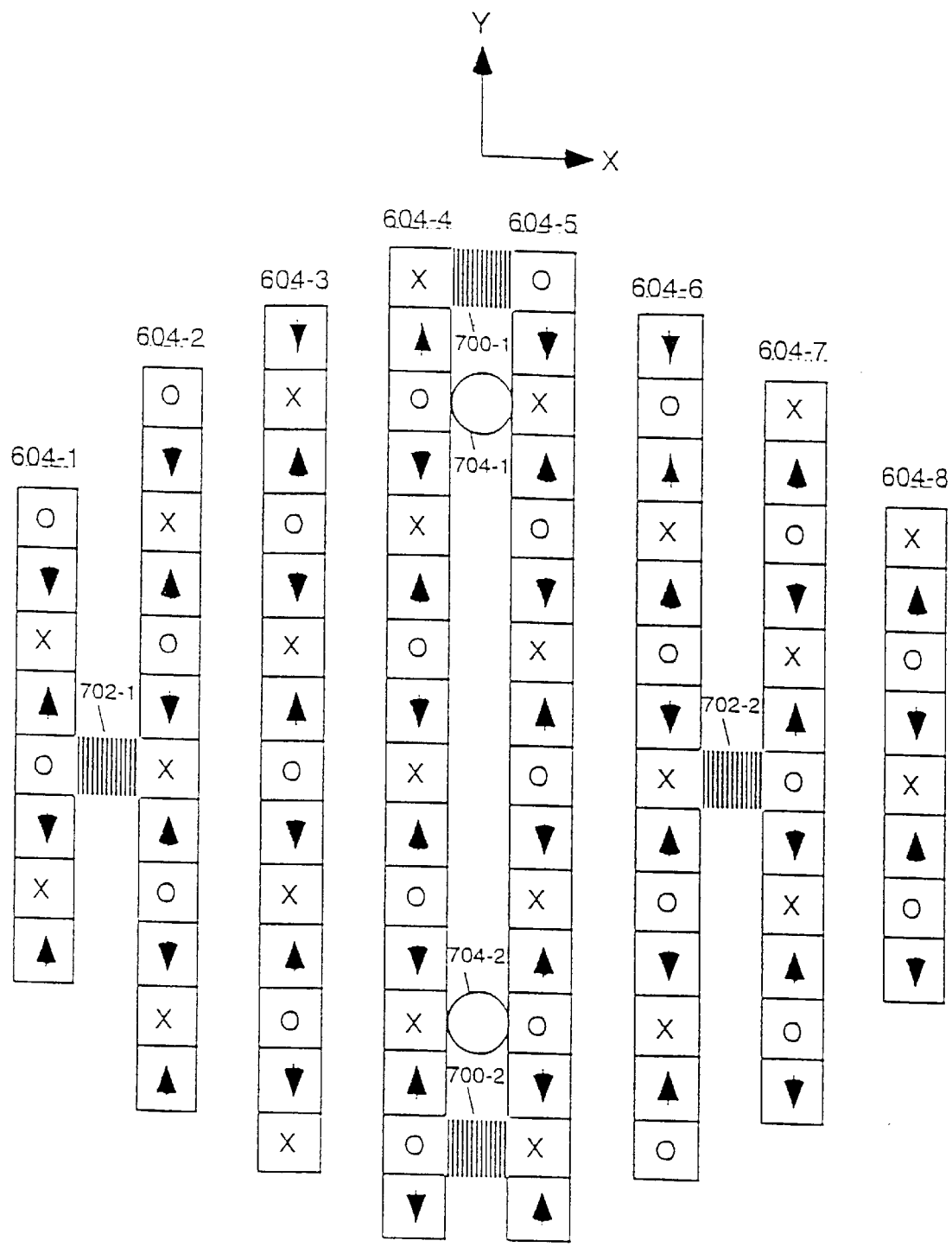
FIG. 7 is a plan view of the configuration of the magnets, including the Halbach magnet arrays, that are physically attached to the wafer support X-Y stage of the preferred embodiment of the present invention shown in FIG. 6.

FIGS. 6 and 7, taken together, show one embodiment of the present invention for an X-Y stage preferably having a circularly-shaped cross-section. Shown in FIG. 6 is movable wafer support X-Y stage 600, in the form of a foreshortened circular cylinder that is as light and stiff as possible (although, in general, the foreshortened cylinder need not have a circularly-shaped cross-section). Wafer 602 is clamped to the circular top surface of stage 600 by means of a vacuum or electrostatic interface (not shown) that operates as a wafer chuck. Typically this top surface is lapped flat to a micron or so. Attached to the circular bottom surface (which is also flat) of stage 600 are eight Halbach magnet arrays 604-1 . . . 604-8 (shown in more detail in FIG. 7, discussed below). Lower wire layer 606 and upper wire layer 608, respectively, comprise a first set of six stationary flat electromagnet coil wires oriented as shown in FIG. 3 and a second set of six stationary flat electromagnet coil wires oriented as shown in FIG. 4. Similar to the single set of six coil wires shown in prior-art FIG. 2, the six coil wires of the first set comprising layer 606 and the six coil wires of the second set comprising layer 608 can all be commutated independently of one another. While it is to be preferred that each of the first and second sets includes six coil wires, as few as four independently-commutated coil wires for each of the first and second sets would suffice. Also, first and second wire layers 606 and 608, which are firmly attached to a heavy, stiff ferromagnetic platen 610 by means of a non-magnetic adhesive 612, are spatially situated to be in cooperative relationship with movable arrays 604-1 . . . 604-8. Therefore, in accordance with the above-described principles of the present invention, selectable lateral and levitation forces for translationally moving movable stage 600 parallel to the X, Y and/or Z axes may be produced Referring now to FIG. 7, each of Halbach permanent magnet arrays 604-1 . . . 604-8 is oriented parallel to the Y axis, with adjacent ones of these arrays being spaced from one another parallel to the X axis by the width of an array magnet. In particular, each of arrays 604-1 and 604-8 comprises eight permanent magnets; each of arrays 604-2 and 604-7 comprises twelve permanent magnets; each of arrays 604-3 and 604-6 comprises fourteen permanent magnets, and each of arrays 604-4 and 604-5 comprises sixteen permanent magnets.

Further, FIG. 7 comprises small cylindrical electromagnet coil pairs 700-1 and 700-2, 702-1 and 702-2 and 704-1 and 704-2 for use in rotationally adjusting the angular position of X-Y stage 600 about one or more of the X, Y and Z axes over a relatively small angular range. This configuration assumes that the weight of wafer stage 600 is not entirely balanced by permanent magnets and that some steady-state current is required for levitation. This provides a means for coils 700-1, 700-2, 702-1, 702-2, 704-1 and 704-2 to interact with the steady-state current and, thereby, provide pitch, roll and yaw correction. Coils 700-1, 700-2, 702-1 and 702-2 are all oriented to generate respective magnetic fields parallel to the X axis which cooperate with the magnetic fields generated by the coil wires of the first and second set to produce respective forces parallel to the Z axis. Spatially displaced coils 700-1 and 700-2, both situated within the gap between arrays 604-4 and 604-5, are energized by currents of opposite phases and equal magnitudes to produce thereby a couple for tilting X-Y stage 600 about the X axis. Coil 702-1, situated within the gap between arrays 604-1 and 604-2 and spatially displaced coil 702-2, situated within the gap between arrays 604-6 and 604-7, are energized by currents of opposite phases and equal magnitudes to produce thereby a couple for tilting X-Y stage 600 about the Y axis. Spatially displaced coils 704-1 and 704-2, both situated within the gap between arrays 604-4 and 604-5, are (1) oriented to generate respective magnetic fields parallel to the Z axis which cooperate with the magnetic fields generated by the coil wires of the first and second set to produce respective forces parallel to the X axis, and (2) are energized by currents of opposite phases and equal magnitudes to produce thereby a couple for yawing X-Y stage 600 about the Z axis. Thus, the three pairs of small coil pairs 700-1 and 700-2, 702-1 and 702-2 and 704-1 and 704-2 can be used to control the three angular degrees of freedom of X-Y stage 600. Although the torques produced are limited by the size of these coils to small values, this is acceptable because the angular accelerations required by the wafer support X-Y stage of a wafer stepper are normally very small and, therefore, only sufficient torque is required to maintain angular stability.

What is claimed is:

1. An apparatus for magnetically positioning a movable X-Y stage with respect to X and Y horizontal axes and a Z vertical axis that comprises:

a first set of a plurality of flat stationary electromagnetic coils of wire that substantially lie in a first horizontal X, Y plane and are angularly offset in said first horizontal X, Y plane by plus an oblique angle with respect to a given one of said X and Y horizontal axes;

a second set of a plurality of flat stationary electromagnetic coils of wire that substantially lie in a second horizontal X, Y plane substantially in vertical alignment with said first horizontal X, Y plane and are angularly offset in said second horizontal X, Y plane by minus said oblique angle with respect to the same one of said X and Y horizontal axes as said first set of coils of wire; and a Halbach array of magnets attached to said movable X-Y stage, wherein said array substantially lies in a third horizontal X, Y plane, is oriented substantially parallel to the same one of said X and Y horizontal axes with respect to which said oblique angles are measured, and is simultaneously situated in a cooperative relationship with both of said first and second sets of coils of wire;

whereby a lateral force in said X and/or Y horizontal directions and/or a vertical force in said vertical Z direction may be selectively generated in accordance with the phase and magnitude of current energizing a wire of some of each of said plurality of flat stationary electromagnetic coils of said first and second sets.

2. The apparatus defined in claim 1, wherein said magnets of said Halbach array are permanent magnets.

3. The apparatus defined in claim 1, wherein:
said given oblique angle is substantially 45°.

4. The apparatus defined in claim 1, comprising:
a plurality of Halbach arrays of magnets attached to said movable X-Y stage, wherein all of said arrays substantially lie in a horizontal X, Y plane, are oriented substantially parallel to the same one of said X and Y horizontal axes, and are situated in cooperative relationship with both the first and second sets of coils of wire;
each of said magnets of each of said plurality of Halbach arrays having substantially the same given length in a direction parallel to said same one of said X and Y horizontal axes and substantially a same given width in a direction parallel to the other one of said X and Y horizontal axes, such that a ratio of said given width to said given length is equal to the tangent of said oblique angle; and
respective centers of identically-poled magnets of adjacent ones of said plurality of Halbach arrays being (1) translationally offset in a direction substantially parallel to said same one of said X and Y horizontal axes by a first distance and (2) translationally offset in a direction substantially parallel to the other one of said X and Y horizontal axes by a second distance with a ratio of said second distance to said first distance also being equal to the tangent of said oblique angle.

5. The apparatus defined in claim 4, wherein:
said first distance is substantially equal to twice said given length and said second distance is substantially equal to twice said given width;
whereby adjacent ones of said plurality of Halbach arrays are spaced from one another in a direction substantially parallel to the other one of the X and Y horizontal axes by a distance substantially equal to said given width.

6. The apparatus defined in claim 5, further comprising a pair of spaced electromagnets attached to said movable X-Y stage, each of said spaced electromagnets being situated in a predetermined space between a pair of adjacent Halbach arrays for generating magnetic fields that cooperate with magnetic fields generated by said first and second sets of flat stationary electromagnet coils of wire to create a couple for tilting said movable X-Y stage about said horizontal X axis.

7. The apparatus defined in claim 5, further comprising a pair of spaced electromagnets attached to said movable X-Y stage, each of said spaced electromagnets being situated in a predetermined space between a pair of adjacent Halbach arrays for generating magnetic fields that cooperate with magnetic fields generated by said first and second sets of flat stationary electromagnet coils of wire to create a couple for tilting said movable X-Y stage about said horizontal Y axis.

8. The apparatus defined in claim 5, further comprising a pair of spaced electromagnets attached to said movable X-Y stage, each of said spaced electromagnets being situated in a predetermined space between a pair of adjacent Halbach arrays for generating magnetic fields that cooperate with magnetic fields generated by said first and second sets of flat stationary electromagnet coils of wire to create a couple for yawing said movable X-Y stage about said vertical Z axis.

9. The apparatus defined in claim 5, wherein:
each of said magnets of said plurality of spaced Halbach arrays is a permanent magnet;
each permanent magnet has a square cross-section; and
said given oblique angle is substantially 45°.

10. The apparatus defined in claim 9, wherein:
said movable X-Y stage is a wafer support X-Y stage in the form of a foreshortened cylinder having said plurality of spaced Halbach arrays of permanent magnets attached to the bottom thereof.

11. The apparatus defined in claim 10, wherein:
said wafer support X-Y stage is in the form of a foreshortened circular cylinder having said plurality of spaced Halbach arrays of permanent magnets attached to the bottom thereof.

12. The apparatus defined in claim 10, wherein:
said foreshortened cylinder of said wafer support X-Y stage has lateral dimensions of at least 200 millimeters.

13. The apparatus defined in claim 10, further comprising:
a ferromagnetic platen; and
a non-magnetic adhesive for attaching said first and second sets of flat stationary electromagnet coils of wire to said platen.

14. The apparatus defined in claim 13, wherein each of said first and second sets of flat stationary electromagnet coils of wire comprises at least four adjacent individually comutatable coiled wires arranged such that each magnet of said plurality of Halbach arrays at any one time is in cooperative relationship with a first subset of at least one of said commutable coil wires of said first set and a second subset of at least one of said comutatable coiled wires of said second set.

15. The apparatus defined in claim 14, wherein said number of said comutatable coiled wires of said first set is six and the number of said comutatable coiled wires of said second set is also six.

16. The apparatus defined in claim 10, wherein:
said foreshortened cylinder of said wafer support X-Y stage has an ordinally-arranged plurality of eight spaced apart Halbach arrays of permanent magnets attached to the bottom thereof which are symmetrically-disposed with respect to both said X and Y axes; and
each of said first and eighth spaced Halbach arrays consists of eight permanent magnets, each of said second and seventh spaced Halbach arrays consists of twelve permanent magnets, each of said third and sixth spaced Halbach arrays consists of fourteen permanent magnets, and each of said fourth and fifth spaced Halbach arrays consists of sixteen permanent magnets.

17. The apparatus defined in claim 16, further comprising:
first, second and third pairs of spaced apart electromagnets attached to said movable X-Y stage;
said spaced apart electromagnets of said first pair being situated (1) with a first given separation between them that is oriented parallel to a first selected one of said X and Y axes and (2) between permanent magnets of said spaced apart Halbach arrays that are poled parallel to said Z vertical axis for generating magnetic fields that cooperate with magnetic fields generated by said first and second sets of flat stationary electromagnet coils of wire to create a couple for tilting said movable X-Y stage about said given one of the X and Y horizontal axes;
said spaced apart electromagnets of said second pair being situated (3) with a second given separation between them that is oriented parallel to a second selected one of said X and Y axes and (4) between permanent magnets of said spaced apart Halbach arrays that are poled parallel to said Z vertical axis for generating magnetic fields that cooperate with magnetic fields generated by said first and second sets of flat stationary electromagnet coils of wire to create a couple for tilting said movable X-Y stage about said other one of the X and Y horizontal axes; and said spaced apart electromagnets of said third pair being situated (5) with a third given separation between them that is oriented parallel to a second selected one of said X and Y axes and (6) between permanent magnets of said spaced apart Halbach arrays that are poled parallel to said Z vertical axis for generating magnetic fields that cooperate with magnetic fields generated by said first and second sets of flat stationary electromagnet coils of wire to create a couple for yawing said movable X-Y stage about said vertical Z axis.

18. The apparatus defined in claim 17, wherein:

both of said first pair of spaced apart electromagnets are situated in said space between the fourth and fifth spaced apart Halbach arrays;

a first of said second pair of spaced apart electromagnets is situated in said space between said first and second spaced apart Halbach arrays and a second of said second pair of spaced apart electromagnets is situated in said space between said sixth and seventh spaced apart Halbach arrays; and both of said third pair of spaced apart electromagnets are situated in said space between the fourth and fifth spaced apart Halbach arrays.

19. The apparatus defined in claim 1, further comprising:

a ferromagnetic platen; and a non-magnetic adhesive for attaching said first and second sets of flat stationary electromagnet coils of wire to said platen.

* * * * *